US006801795B2

(12) United States Patent
Pan

(10) Patent No.: US 6,801,795 B2
(45) Date of Patent: Oct. 5, 2004

(54) CELLULAR TELEPHONE WITH A CHANGEABLE KEY ARRANGEMENT

(75) Inventor: Long-Jyh Pan, Taipei Hsien (TW)

(73) Assignee: BenQ Corporation, Tao-Yuan Hsien 333 (TW)

( * ) Notice: Subject to any disclaimer, the term of this patent is extended or adjusted under 35 U.S.C. 154(b) by 650 days.

(21) Appl. No.: 09/820,295

(22) Filed: Mar. 29, 2001

(65) Prior Publication Data

US 2001/0041582 A1 Nov. 15, 2001

(30) Foreign Application Priority Data

May 3, 2000  (TW) ....................................... 89108449 A

(51) Int. Cl.[7] ................................................. H04B 1/38
(52) U.S. Cl. ................ 455/575.1; 455/349; 379/433.07
(58) Field of Search ............................ 455/90.3, 575.1, 455/128, 347–351; 379/433.07; 361/814, 816; 345/168; 200/344

(56) References Cited

U.S. PATENT DOCUMENTS 5,146,615 A  *  9/1992  Hodsdon et al. ........... 455/90.3

5,722,055 A     2/1998  Kobayashi et al.
5,832,371 A  * 11/1998  Thornton ................. 455/575.1

FOREIGN PATENT DOCUMENTS

| DE | 30 03 714   | 8/1980 |
| DE | 90 12 788.9 | 1/1991 |
| DE | 296 19 382  | 3/1997 |
| DE | 42 44 815   | 4/1997 |
| DE | 196 39 197  | 5/1998 |
| DE | 197 50 307  | 5/1999 |

* cited by examiner

Primary Examiner—Lee Nguyen
(74) Attorney, Agent, or Firm—Winston Hsu

(57) ABSTRACT

A cellular telephone with a changeable key arrangement has a housing, a first circuit board, a second circuit board, and a processor. The housing has a plurality of keys arranged in a first manner. The first circuit board is a rigid printed circuit board having a first connector on an upper side of the first circuit board. The second circuit board is installed above the first circuit board and below the plurality of keys. The second circuit board has a plurality of key switches arranged in the first manner for interacting with the plurality of keys to generate corresponding key-pressing signals, and a second connector detachably connected with the first connector for transmitting the key-pressing signals. The second circuit board is changeable so that keys arranged with different patterns can be installed onto the housing.

18 Claims, 5 Drawing Sheets

CELLULAR TELEPHONE WITH A CHANGEABLE KEY ARRANGEMENT

BACKGROUND OF THE INVENTION

1. Field of the Invention

The present invention relates to a cellular telephone. More specifically, a cellular telephone with a changeable key arrangement is disclosed.

2. Description of the Prior Art

Recently, the price of cellular telephone has been greatly reduced and become affordable to lots of people. It is common that a person owns more than one cellular phone. Some people even replace their cellular telephones as often as they replace their clothes or watches. In another aspect, consumers tend to buy new models instead of old ones. Therefore, cellular telephone manufactures must launch new models with different appearances and styles more frequently so as to draw consumers' attention and enjoy a more favorable market share.

To change the appearances of cellular telephones, some cellular telephones have been equipped with changeable-covers. However, regardless how the cover is changed, the overall change in appearance is limited because the key arrangements of these cellular phones are still fixed.

The cellular telephone industry, like other industries, has evolved into a vertical market structure. Some manufacturers specialize in design and mass production of cellular phones, while other companies focus on bringing these products to the market using their own brand. These are so called original design manufacture (ODM), or original equipment manufacture (OEM), products. However, to differentiate their products from other competitors, clients usually ask these manufacturers to produce products having greatly different appearances. As a result, to provide new clients with new product appearances, the manufacturers must redesign their products and pass many certification requirements. This is uneconomic and time consuming for these manufactures.

Based upon experiences in product development, it becomes clear to the inventor that the change of appearances of cellular telephones is usually restricted by the key arrangement. If there is an easy and inexpensive way to change the key arrangement of cellular telephones, the mentioned problems could be solved.

Please refer to FIG. 1. FIG. 1 is a schematic diagram of a conventional cellular telephone 10. The conventional cellular telephone 10 has a housing 12, a printed circuit board 14, and a plurality of keys 16. The printed circuit board 14 has a plurality of key switches 18 for interacting with the plurality of keys 16 to generate corresponding key-pressing signals. The arrangement of the keys 16 must be the same as the arrangement of the key switches 18. Conventionally, if it is desired that the key arrangement be changed, the key switch arrangement must first be changed. That means the circuitry of the printed circuit board 14 must be changed as well, i.e. a new circuit board is required. As the printed circuit board 14 is usually a rigid circuit board, and has a high cost, it is not economical to change the key arrangement.

SUMMARY OF THE INVENTION

It is therefore a primary objective of this invention to provide a cellular telephone that can easily and economically change its key arrangement.

The present invention, briefly summarized, discloses a cellular telephone having a housing, a first circuit board installed in the housing, and a second circuit board installed above the first circuit board. The housing has a plurality of keys arranged in a first manner. The first circuit board is a rigid printed circuit board having a first connector on an upper side of the first circuit board. The second circuit board is below the plurality of keys. The second circuit board has a plurality of key switches arranged in the first manner for interacting with the plurality of keys to generate corresponding key-pressing signals, and a second connector detachably connected with the first connector for transmitting the key-pressing signals. The second circuit board is changeable so that keys arranged in different patterns can be installed onto the housing.

It is an advantage of the present invention that the key arrangement can be easily changed by changing the second circuit board instead of the first circuit board. Thus, manufacturers and users can design or use cellular telephones with greater flexibility, as needed.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
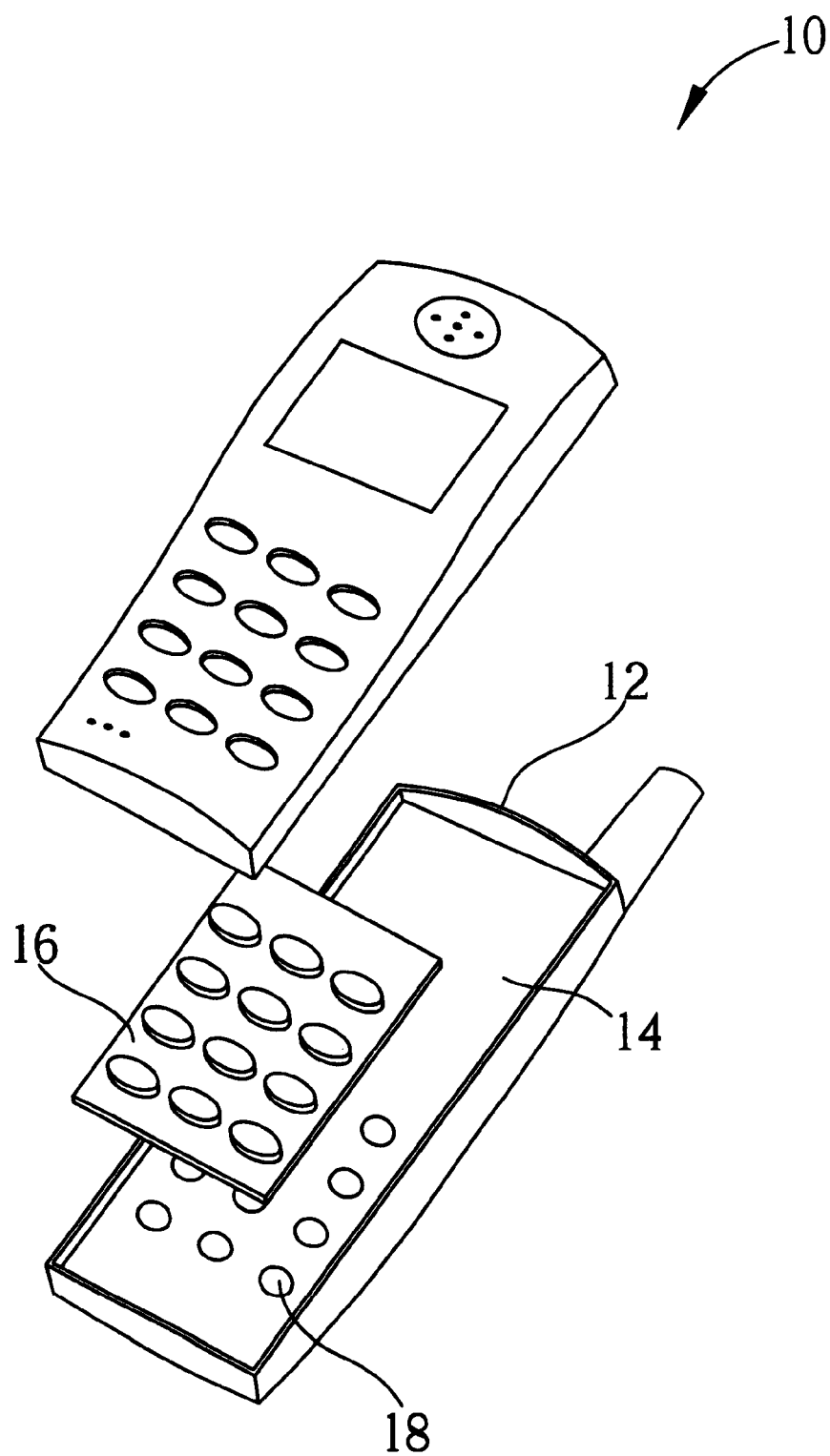
FIG. 1 is a schematic diagram of a conventional cellular telephone.
Figure 2:
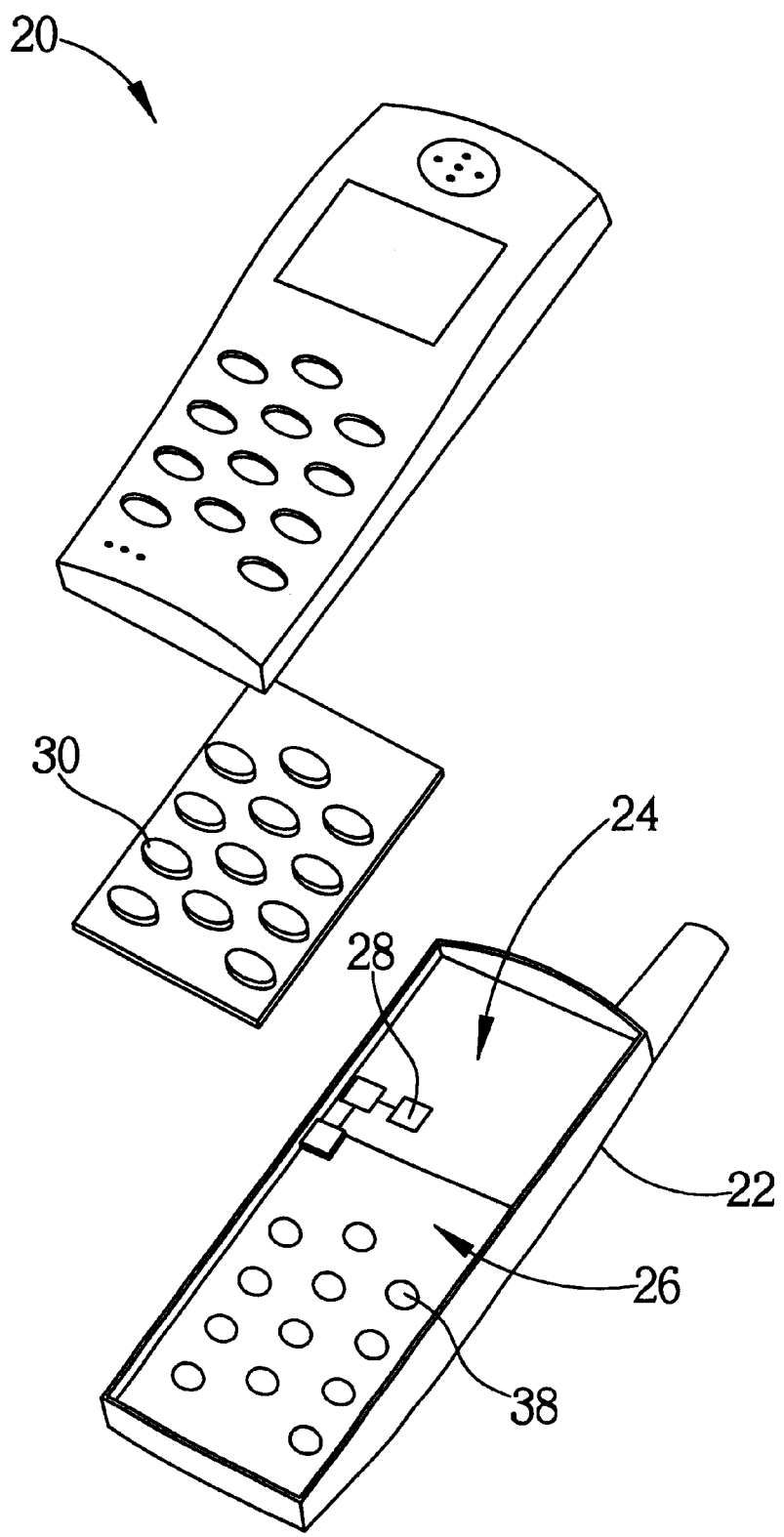
FIG. 2 is a schematic diagram of a cellular telephone according to the present invention.
Figure 3:
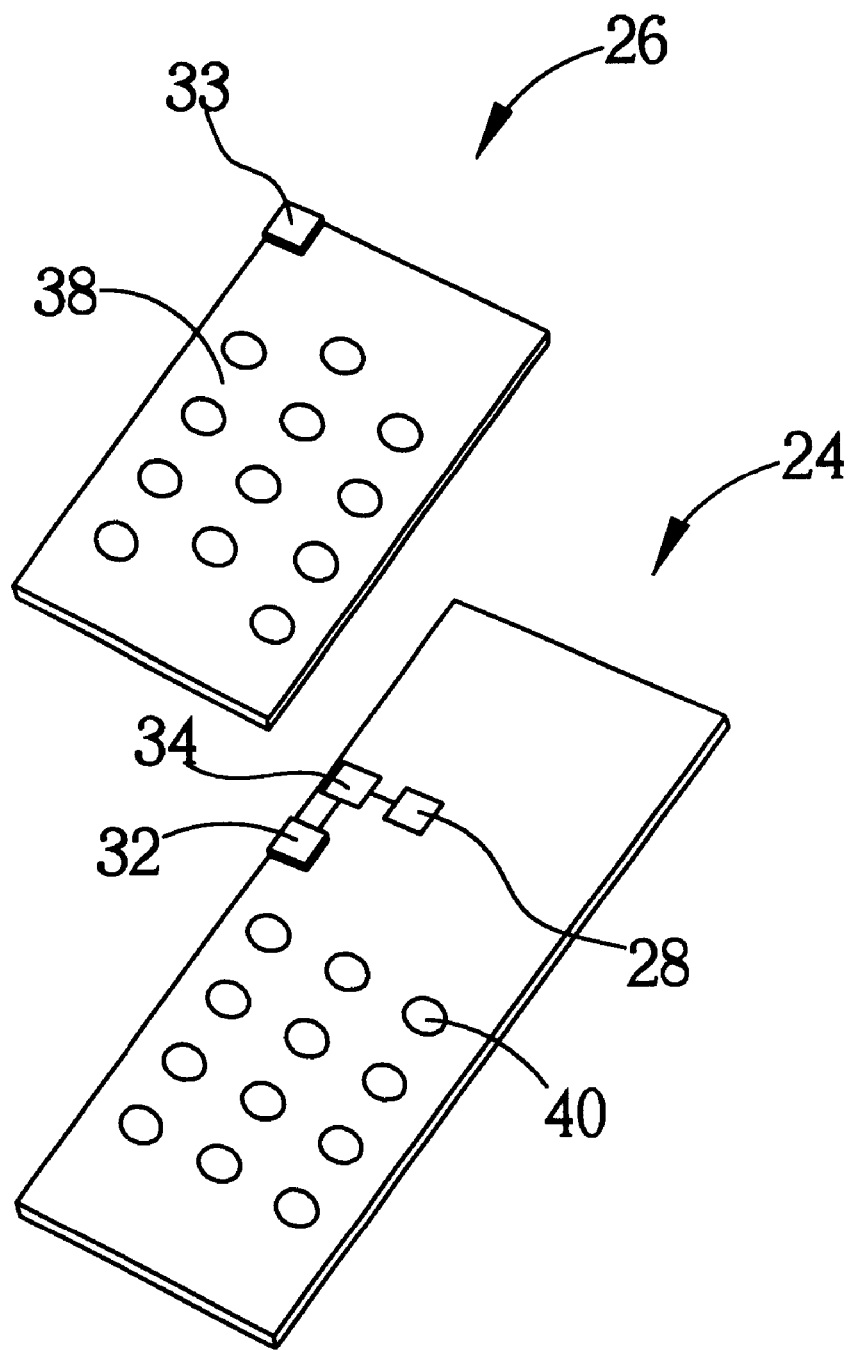
FIG. 3 is a schematic diagram of first and second circuit boards shown in FIG. 2.

Please refer to FIG. 2 and FIG. 3. FIG. 2 is a schematic diagram of a cellular telephone 20 according to the present invention. FIG. 3 is a schematic diagram of first and second circuit boards 24, 26 shown in FIG. 2. The cellular telephone 20 comprises a housing 22, a first circuit board 24, a second circuit board 26, and a plurality of keys 30 arranged in a first manner. The first and second circuit boards 24, 26 are installed inside the housing 22. The second circuit board 26 is below the plurality of keys, and fixed on the first circuit board 24 with a fastener or screws.

As shown in FIG. 3, the first circuit board 24 is a rigid printed circuit board. The first circuit board 24 has a first connector 32, a switch device 34, a processor 28, and a plurality of key switches 40 arranged in a second manner. The second circuit board 26 is a flexible printed circuit board (FPCB), which comprises a second connector 33, and a plurality of key switches 38 arranged in the first manner on an upper side of the second circuit board 26. The key switches 38 are used to interact with the plurality of keys 30 to generate corresponding key-pressing signals. The second connector 33 is detachably connected with the first connector 32 for transmitting the key-pressing signals.

The processor 28 is installed inside the housing 22 and is electrically connected to the first connector 32 for processing the key-pressing signals from the first circuit board 24 or the second circuit board 26 to control the cellular telephone 20. The second circuit board 26 is changeable so that keys arranged in different manners can be installed onto the housing 22.

The switch device 34 is electrically connected between the processor 28 and the key switches 40, 38 of the first and second circuit boards 24, 26, and is used to switch the processor 28 between the key switches 40, 38 of the first or second circuit boards 24, 26. The switch device 34 thus determines which key-pressing signals are sent to the processor 28.

Figure 4:
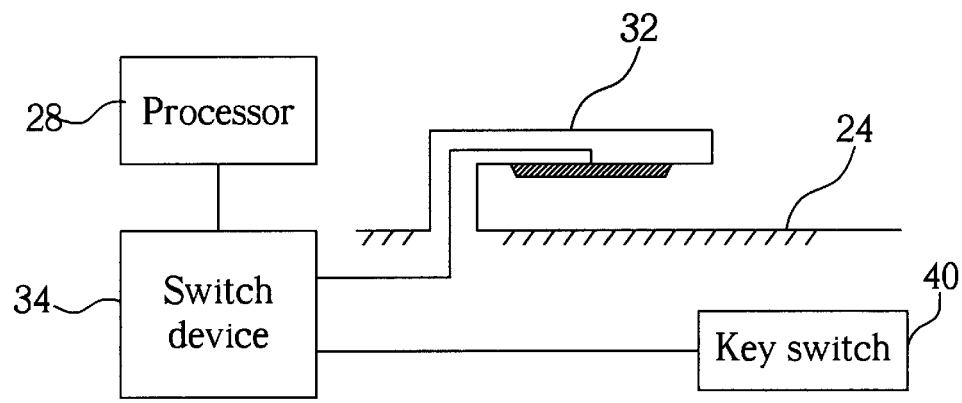
FIG. 4 depicts a second connector that is not plugged into a first connector shown in FIG. 2.
Figure 5:
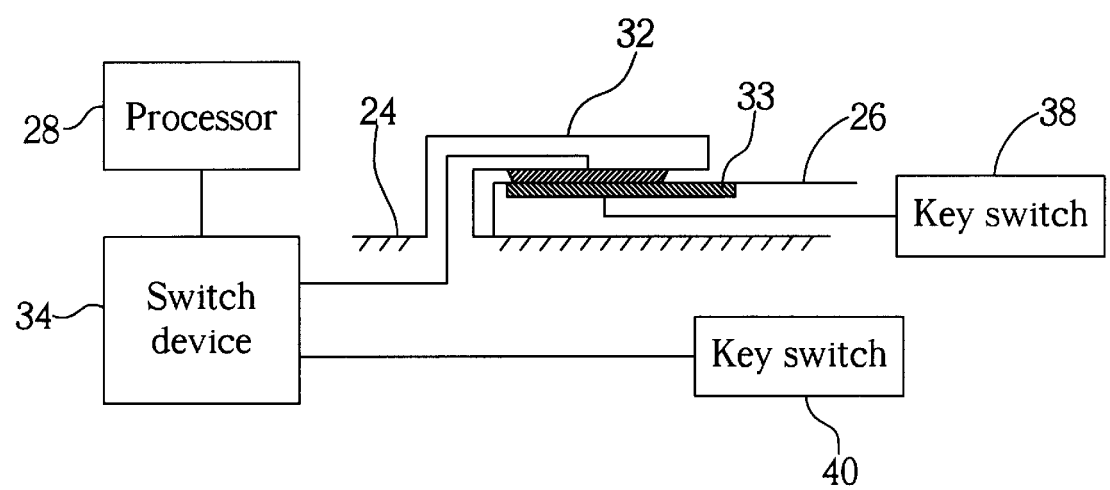
FIG. 5 depicts a second connector plugged into a first connector shown in FIG. 2.

Please refer to FIG. 4 and FIG. 5. FIG. 4 depicts the second connector 33 not plugged into the first connector shown in FIG. 2. FIG. 5 depicts the second connector 33 plugged into the first connector shown in FIG. 2. As shown in FIG. 4, when the second connector 33 of the second circuit board 26 is not plugged into the first connector 32 of the first circuit board 24, the switch device 34 will electrically connect the key switches 40 of the first circuit board 24 to the processor 28 so that the key-pressing signals generated by the first circuit board 24 can be transmitted to the processor 28. As shown in FIG. 5, when the second connector 33 of the second circuit board 26 is plugged into the first connector 32 of the first circuit board 24, the switch device 34 will electrically connect the key switches 38 of the second circuit board 26 to the processor 28 so that the key-pressing signals generated by the second circuit board 26 can be transmitted to the processor 28. The switching action of the switch device 34 can be automatic or manual. If the switch device 34 is to switch automatically, the switch device 34 must sense the existence of the second circuit board 26, and switch the processor 28 to the key switches 38 of the second circuit boards 26. When the switch device 34 is switched manually, the users or the manufacturers can set the connection to be either between the processor 28 and the key switches 40 of the first circuit board 24, or between the processor 28 and key switches 38 of the second circuit board 26.

Figure 6:
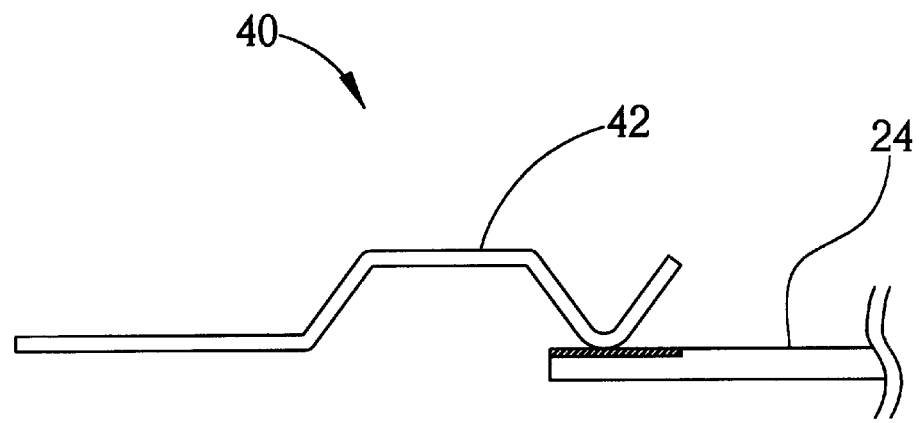
FIG. 6 is another embodiment first connector of the cellular phone shown in FIG. 2.
Figure 7:
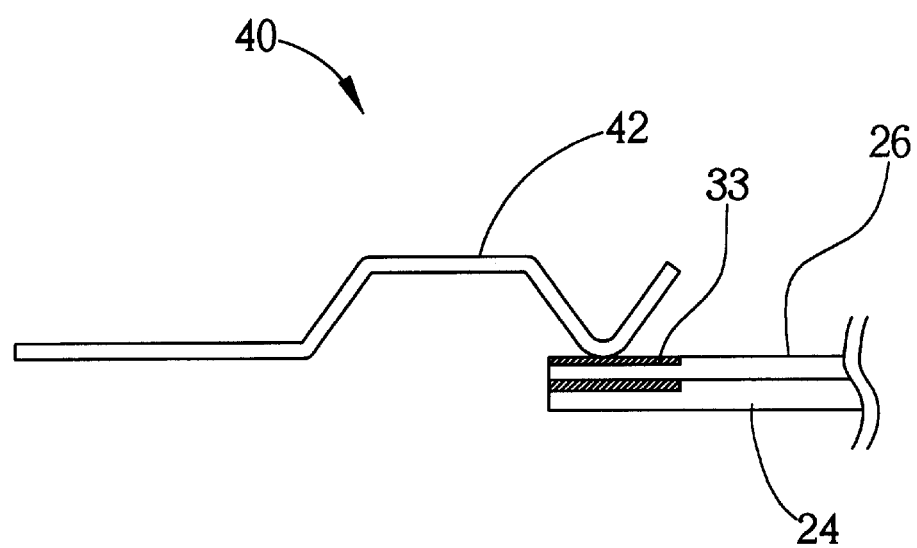
FIG. 7 depicts a second circuit board shown in FIG. 2 plugged into a first connector shown in FIG. 6.

Please refer to FIG. 6 and FIG. 7. FIG. 6 is another embodiment first connector 40 of the cellular phone 20 shown in FIG. 2. FIG. 7 depicts the second circuit board 26 shown in FIG. 2 plugged into the first connector 40 shown in FIG. 6. As shown in FIG. 6, the first connector 40 of the first circuit board 24 comprises at least one elastic metallic piece 42, and the metallic piece 42 is in contact with the first circuit board 24 so as to form an electrical connection between the first circuit board 24 and the processor 28. When the second circuit board 26 is plugged into the first circuit board 24, as shown in FIG. 7, the metallic piece 42 is lifted by the second circuit board 26, and an electrical connection between the second circuit board 26 and the processor 28 is established to replace the electrical connection between the first circuit board 24 and the processor 28. This could also achieve the switching function without the said switch device 34.

In contrast to the conventional art, the present invention comprises a changeable second circuit board 26, and the key arrangement is thus not restricted by the first circuit board 24. In addition, the changeable second circuit board 26 is flexible printed circuit board (FPCB), therefore the cost of changing the second circuit board 26 is low. Therefore, the manufacturers can design many different kinds of second circuit board 26 with different key switch arrangements so as to change the appearance of the cellular telephone with low cost, and meet the clients' needs. Because this method avoids redesigning of the original circuitry of the cellular telephone, a large amount of redesign cost and time is saved, and additional certification requirements can also be avoided.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A cellular telephone comprising:

a housing having a plurality of keys arranged in a second manner on an upper side of the housing;

a first circuit board installed inside the housing, the first circuit board having a first connector and comprising a plurality of first key switches arranged in a first manner on the first circuit board;

a second circuit board installed inside the housing, the second circuit board having a plurality of second key switches arranged in the second manner for interacting with the plurality of keys to generate corresponding key-pressing signals, and a second connector detachably connected with the first connector for transmitting the key-pressing signals;

a processor installed inside the housing and electrically connected to the first connector; and a switch device electrically connected between the processor and the first key switches and the second key switches for switching the processor between the first key switches or the second key switches, wherein when the second connector of the second circuit board is plugged into the first connector of the first circuit board, the switch device will electrically connect the second key switches of the second circuit board to the processor so that the key-pressing signals generated by the second circuit board can be transmitted to the processor, and when the second connector of the second circuit board is not plugged into the first connector of the first circuit board, the switch device will electrically connect the first key switches of the first circuit board to the processor so that the key-pressing signals generated by the first circuit board can be transmitted to the processor.

2. The cellular telephone of claim 1 wherein the processor is installed on the first circuit board.

3. The cellular telephone of claim 1 wherein the second circuit board is a flexible printed circuit board (FPCB).

4. The cellular telephone of claim 1 wherein the second circuit board is fixed on the first circuit board with a fastener or screws.

5. The cellular telephone of claim 1 wherein the first connector of the first circuit board further comprises at least one metallic piece, and the metallic piece is in contact with the first circuit board so as to form an electrical connection between the first circuit board and the processor, and when the second circuit board is plugged into the first circuit board, the metallic piece will be lifted by the second circuit board, and an electrical connection between the second circuit board and the processor is established to replace the electrical connection between the first circuit board and the processor.

6. The cellular telephone of claim 1 wherein the first connector is electrically connected to the first circuit board and formed above the first circuit board, thereby creating a gap between the first circuit board and the first connector, and when the second circuit board is plugged into the gap created between the first circuit board and the first connector, the second connector formed on an upper surface of the second circuit board makes electrical contact with the first connector to establish electrical connection between the second circuit board and the processor.

7. A cellular telephone comprising:

a housing having a plurality of keys arranged in a second manner on en upper side of the housing;

a first circuit board installed inside the housing, the first circuit board having a first connector;

a second circuit board installed inside the housing, the second circuit board having a plurality of second key switches arranged in the second manner for interacting with the plurality of keys to generate corresponding key-pressing signals, and a second connector detachably connected with the first connector for transmitting the key-pressing signals; and a processor installed inside the housing and electrically connected to the first connector;

wherein when the second connector connects with the first connector, the key-pressing signals from the second circuit board will be received by the processor to control the cellular telephone;

wherein the first connector of the first circuit board further comprises at least one metallic piece, and the metallic piece is in contact with the first circuit board so as to form an electrical connection between the first circuit board and the processor, and when the second circuit board is plugged into the first circuit board, the metallic piece will be lifted by the second circuit board, and an electrical connection between the second circuit board and the processor is established to replace the electrical connection between the first circuit board and the processor.

8. The cellular telephone of claim 7 wherein the processor is installed on the first circuit board.

9. The cellular telephone of claim 7 wherein the second circuit board is a flexible printed circuit board (FPCB).

10. The cellular telephone of claim 7 wherein the second circuit board is fixed on the first circuit board with a fastener or screws.

11. The cellular telephone of claim 7 wherein the first circuit board further comprises a plurality of first key switches arranged in a first manner on the first circuit board, and a switch device is electrically connected between the processor and the first key switches and the second key switches for switching the processor between the first key switches or the second key switches, wherein when the second connector of the second circuit board is plugged into the first connector of the first circuit board, the switch device will electrically connect the second key switches of the second circuit board to the processor so that the key-pressing signals generated by the second circuit board can be transmitted to the processor, and when the second connector of the second circuit board is not plugged into the first connector of the first circuit board, the switch device will electrically connect the first key switches of the first circuit board to the processor so that the key-pressing signals generated by the first circuit board can be transmitted to the processor.

12. The cellular telephone of claim 7 wherein the first connector is electrically connected to the first circuit board and formed above the first circuit board, thereby creating a gap between the first circuit board and the first connector, and when the second circuit board is plugged into the gap created between the first circuit board and the first connector, the second connector formed on an upper surface of the second circuit board makes electrical contact with the first connector to establish electrical connection between the second circuit board and the processor.

13. A cellular telephone comprising:

a housing having a plurality of keys arranged in a second manner on an upper side of the housing;

a first circuit board installed inside the housing, the first circuit board having a first connector;

a second circuit board installed inside the housing, the second circuit board having a plurality of second key switches arranged in the second manner for interacting with the plurality of keys to generate corresponding key-pressing signals, and a second connector detachably connected with the first connector for transmitting the key-pressing signals; and a processor installed inside the housing and electrically connected to the first connector;

wherein when the second connector connects with the first connector, the key-pressing signals from the second circuit board will be received by the processor to control the cellular telephone;

wherein the first connector is electrically connected to the first circuit board and formed above the first circuit board, thereby creating a gap between the first circuit board and the first connector, and when the second circuit board is plugged into the gap created between the first circuit board and the first connector, the second connector formed on an upper surface of the second circuit board makes electrical contact with the first connector to establish electrical connection between the second circuit board and the processor.

14. The cellular telephone of claim 13 wherein the processor is installed on the first circuit board.

15. The cellular telephone of claim 13 wherein the second circuit board is a flexible printed circuit board (FPCB).

16. The cellular telephone of claim 13 wherein the second circuit board is fixed on the first circuit board with a fastener or screws.

17. The cellular telephone of claim 13 wherein the first circuit board further comprises a plurality of first key switches arranged in a first manner on the first circuit board, and a switch device is electrically connected between the processor and the first key switches and the second key switches for switching the processor between the first key switches or the second key switches, wherein when the second connector of the second circuit board is plugged into the first connector of The first circuit board, the switch device will electrically connect the second key switches of the second circuit board to the processor so that the key-pressing signals generated by the second circuit board can be transmitted to the processor, and when the second connector of the second circuit board is not plugged into the first connector of the first circuit board, the switch device will electrically connect the first key switches of the first circuit board to the processor so that the key-pressing signals generated by the first circuit board can be transmitted to the processor.

18. The cellular telephone of claim 13 wherein the first connector of the first circuit board further comprises at least one metallic piece, and the metallic piece is in contact with the first circuit board so as to form an electrical connection between the first circuit board and the processor, and when the second circuit board is plugged into The first circuit board, the metallic piece will be lifted by the second circuit board, and an electrical connection between the second circuit board and the processor is established to replace the electrical connection between the first circuit board and the processor.

\* \* \* \* \*